United States Patent
Fujita et al.

(10) Patent No.: US 8,427,517 B2
(45) Date of Patent: Apr. 23, 2013

(54) LIGHT-EMITTING ELEMENT, EXPOSURE HEAD AND IMAGE-FORMING APPARATUS

(75) Inventors: Tetsuji Fujita, Chino (JP); Hidetoshi Yamamoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 419 days.

(21) Appl. No.: 12/726,661

(22) Filed: Mar. 18, 2010

(65) Prior Publication Data
US 2010/0245793 A1 Sep. 30, 2010

(30) Foreign Application Priority Data
Mar. 26, 2009 (JP) ................. 2009-077819

(51) Int. Cl.
*B41J 2/45* (2006.01)
*H01L 29/08* (2006.01)

(52) U.S. Cl.
USPC .......................................... 347/238; 257/40

(58) Field of Classification Search .................. 347/238; 257/40
See application file for complete search history.

(56) References Cited

U.S. PATENT DOCUMENTS

| | | |
|---|---|---|
| 2003/0027016 A1 | 2/2003 | Ara et al. |
| 2005/0179370 A1* | 8/2005 | Nakayama et al. ........... 313/504 |
| 2006/0088729 A1* | 4/2006 | Begley et al. ................. 428/690 |
| 2008/0026496 A1* | 1/2008 | Shiang et al. .................... 438/22 |
| 2009/0066779 A1* | 3/2009 | Sowa et al. ..................... 347/238 |
| 2010/0243992 A1* | 9/2010 | Tsuji et al. ....................... 257/40 |

FOREIGN PATENT DOCUMENTS

| JP | A-2-4546 | 1/1990 |
|---|---|---|
| JP | 2003-338377 A | 11/2003 |
| JP | B2-4024009 | 10/2007 |

\* cited by examiner

*Primary Examiner* — Stephen Meier
*Assistant Examiner* — Sarah Al Hashimi
(74) *Attorney, Agent, or Firm* — Oliff & Berridge, PLC

(57) ABSTRACT

A light-emitting element includes a cathode, an anode, a luminescent layer disposed between the cathode and the anode, a first electron transport layer disposed between the luminescent layer and the cathode, and a second electron transport layer in contact with the luminescent layer and the first electron transport layer between the luminescent layer and the first electron transport layer. The luminescent layer contains a red luminescent material emitting red light. The first electron transport layer contains a first electron transport material. The second electron transport layer contains a second electron transport material different from the first electron transport material.

17 Claims, 5 Drawing Sheets

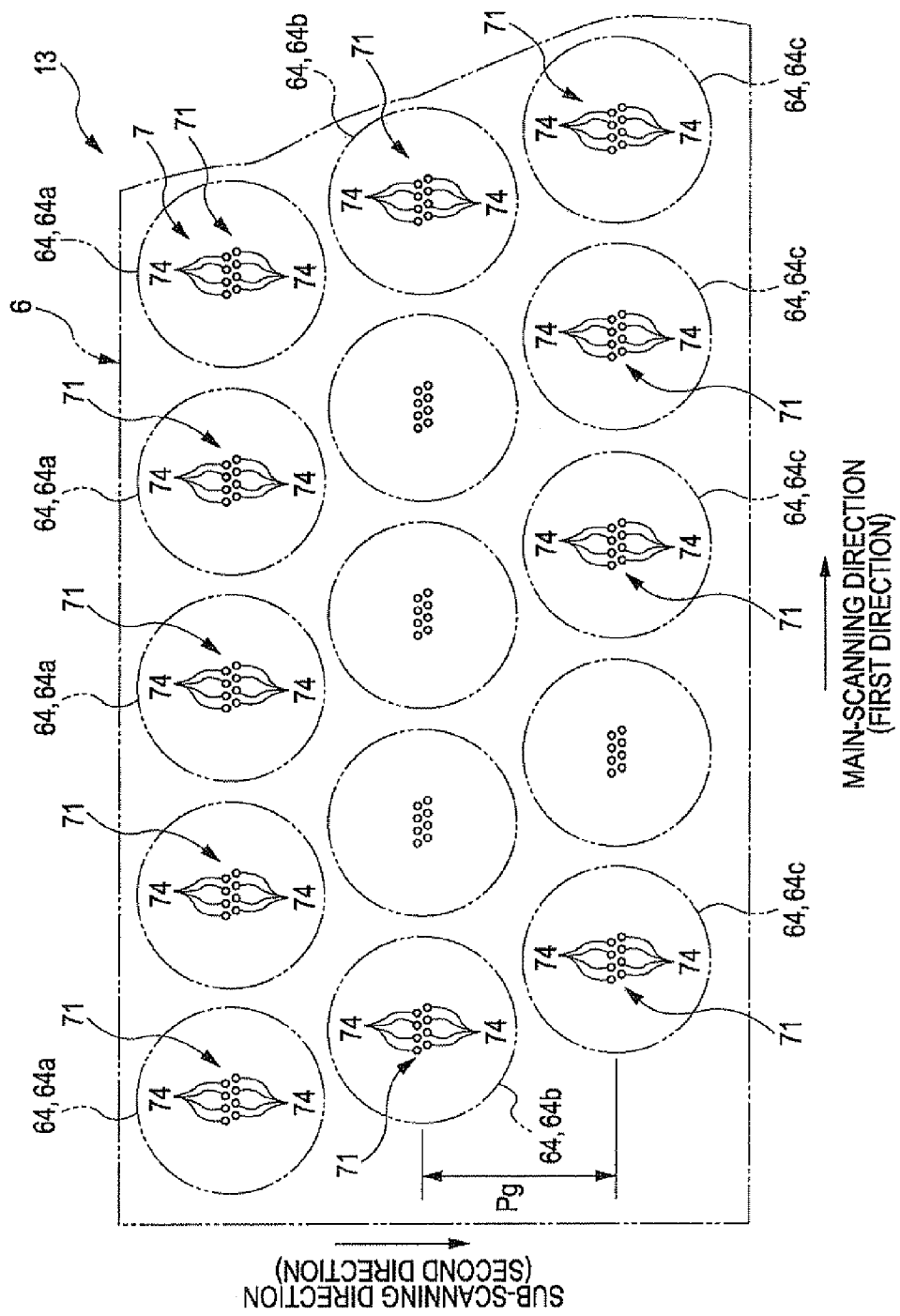

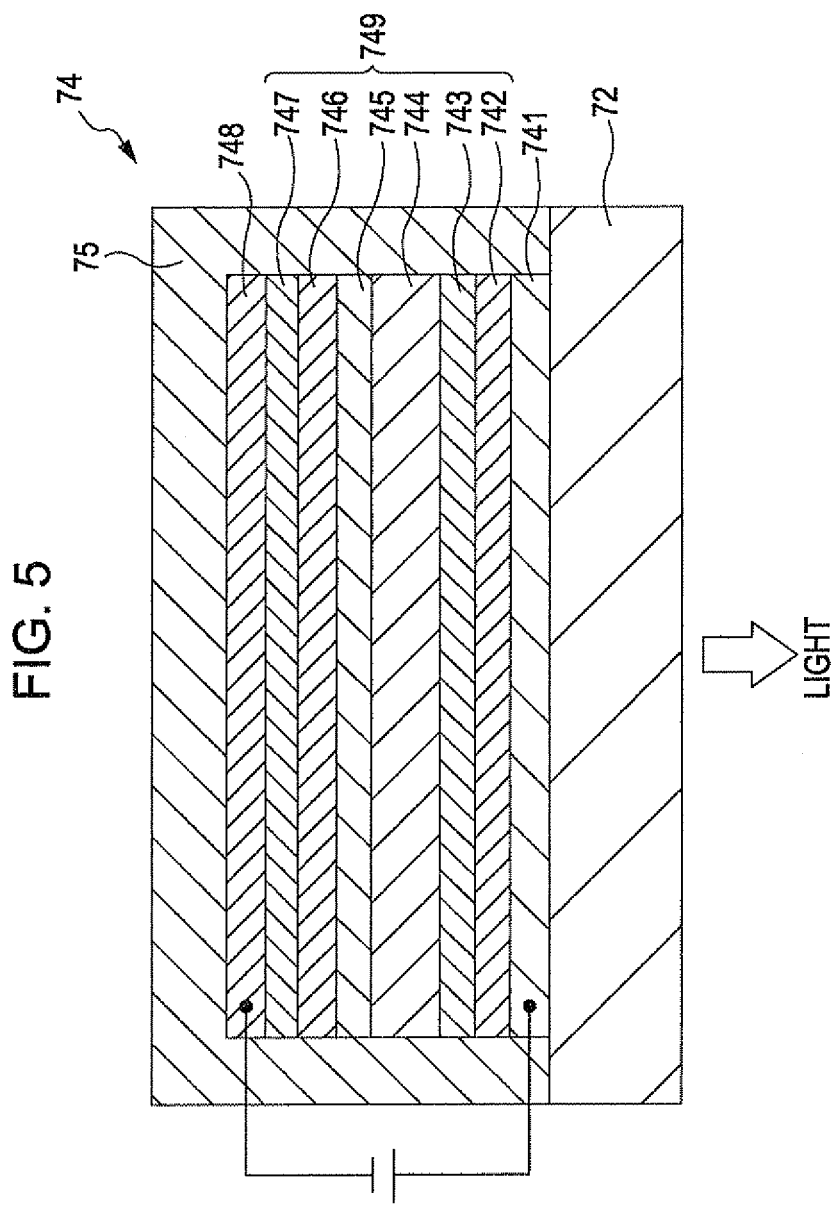

LIGHT-EMITTING ELEMENT, EXPOSURE HEAD AND IMAGE-FORMING APPARATUS

BACKGROUND

1. Technical Field

The present invention relates to a light-emitting element, an exposure head and an image-forming apparatus.

2. Related Art

An image-forming apparatus, such as a copying machine or a printer, using an electrophotographic method includes an exposure device exposing the external surface of a rotating photoreceptor to form an electrostatic latent image. Among such exposure devices is an exposure head including a plurality of light-emitting elements arranged in the direction of the rotating shaft of the photoreceptor (for example, JP-A-2-4546).

For example, the exposure head disclosed in JP-A-2-4546 has a structure in which LED array chips, each including a plurality of light-emitting elements (LEDs) are arranged in one direction.

It is however difficult to increase the resolution of an image-forming apparatus including the exposure head of the above patent document because only a relatively small number of inorganic LEDs can be arranged in a unit area.

Accordingly, it is proposed that organic electroluminescent elements (organic EL elements) be used as the light-emitting elements of the exposure head.

An organic EL element includes an anode, a cathode and a luminescent layer between these electrodes. In this type of light-emitting element, electrons and holes are injected to the luminescent layer respectively from the cathode and the anode by applying an electric field between the cathode and the anode, and the electrons and the holes are recombined to each other to form excitons in the luminescent layer. When the excitons return to the ground state, the energy is emitted as light.

For example, for use in an exposure head of light having a peak wavelength of 600 nm, the light-emitting element preferably emits light having an intensity of 20,000 cd/m$^2$ or more, and has a lifetime (time period for which the luminance is reduced by 10%) of 1000 hours or more.

For example, Japanese Patent No. 4024009 discloses a highly efficient, long-life organic EL element emitting red light including a luminescent layer containing a naphthacene derivative and a diindenoperylene derivative.

However, the lifetime of this organic EL element is not sufficient to satisfy the characteristics required for the exposure head.

SUMMARY

An advantage of some aspects of the invention is that it provides a long-life light-emitting element emitting bright red light, and a reliable exposure head and image-forming apparatus including the light-emitting elements.

Accordingly, a light-emitting element is provided which includes a cathode, an anode, a luminescent layer disposed between the cathode and the anode, a first electron transport layer disposed between the luminescent layer and the cathode, and a second electron transport layer in contact with the luminescent layer and the first electron transport layer between the luminescent layer and the first electron transport layer. The luminescent layer contains a red luminescent material emitting red light. The first electron transport layer contains a first electron transport material. The second electron transport layer contains a second electron transport material different from the first electron transport material.

This structure prevents holes having passed through the luminescent layer from the anode toward the cathode from further transferring closer to the cathode even if a high current is applied between the cathode and the anode. Accordingly, even if the luminescent layer emits red light with high luminance, the light-emitting element 74 can be prevented from deteriorating to enhance the lifetime thereof.

Preferably, the red luminescent material is a diindenoperylene derivative. The use of a diindenoperylene derivative allows the luminescent layer to emit red light with high luminance.

Preferably, the luminescent layer further contains a naphthacene derivative. Such a luminescent layer can efficiently emit red light with higher luminance.

Preferably, the second electron transport layer mainly contains tris(8-quinolinolate)aluminum.

Tris(8-quinolinolate)aluminum ($Alq_3$) can capture holes. Accordingly, the second electron transport layer containing $Alq_3$ can capture holes having passed through the luminescent layer from the anode toward the cathode. Thus, the second electron transport layer can prevent the holes from further transferring closer to the cathode (to the first electron transport layer) effectively.

Preferably, the second electron transport layer further contains a rubrene derivative.

Rubrene derivatives can convert holes to heat or light. Accordingly, in the second electron transport layer containing $Alq_3$ and, in addition, a rubrene derivative, the rubrene derivative can convert holes captured by the $Alq_3$ to heat or light. Consequently, the second electron transport layer ($Alq_3$) can be prevented from deteriorating and altering.

Preferably, the rubrene derivative content in the second electron transport layer is in the range of 0.5% to 20% by weight.

Such a second electron transport layer can reduce the driving voltage and increase the lifetime of the light-emitting element.

Preferably, the first electron transport layer and the second electron transport layer satisfy the relationship $10\% \leq A/B < 90\%$, wherein A represents the thickness of the second electron transport layer and B represents the thickness of the first electron transport layer.

Such thicknesses of the first and second electron transport layers can reduce the driving voltage and increase the lifetime of the light-emitting element.

Preferably, the second electron transport layer has a thickness in the range of 2 to 15 nm.

Such a second electron transport layer can reduce the driving voltage and increase the lifetime of the light-emitting element.

Preferably, the total thickness of the first electron transport layer and the second electron transport layer is in the range of 10 to 100 nm.

Such thicknesses of the first and second electron transport layers can reduce the driving voltage and increase the lifetime of the light-emitting element.

Preferably, the first electron transport layer contains a phenanthroline derivative.

Such a first electron transport layer can be superior in electron transport ability. Consequently, the luminous efficiency of the light-emitting element can be enhanced.

Preferably, the first electron transport layer and the second electron transport layer have an interface containing the first electron transport material and the second electron transport material therebetween.

Such a structure facilitates the transfer of electrons from the first electron transport layer to the second electron transport layer. Consequently, the luminous efficiency of the light-emitting element can be enhanced.

According to another aspect of the invention, an exposure head is provided which includes the above-described light-emitting element.

The exposure head can use an organic EL element as the light-emitting element so that its lifetime can be increased.

Preferably, the exposure head further includes an imaging optical system focusing light from the light-emitting element. In this instance, a plurality of the light-emitting elements are arranged in one direction and emit light to a light emitting side, and the imaging optical system is disposed at the light emitting side of the light-emitting elements.

Such an exposure head can perform high resolution exposure.

According to another aspect of the invention, an image-forming apparatus is provided which includes the above-described exposure head.

The image-forming apparatus can be reliable and can form high-quality images.

BRIEF DESCRIPTION OF THE DRAWINGS

The invention will be described with reference to the accompanying drawings, wherein like numbers reference like elements.

FIG. 4 is a plan view of the exposure head shown in FIG. 2, showing the positional relation between lenses and light-emitting elements.

FIG. 5 is a schematic sectional view of the light-emitting element of the exposure head shown in FIG. 2.

DESCRIPTION OF EXEMPLARY EMBODIMENTS

Preferred embodiments of the light-emitting element, the exposure head and the image-forming apparatus of the invention will now be described with reference to the attached drawings.

Figure 1:
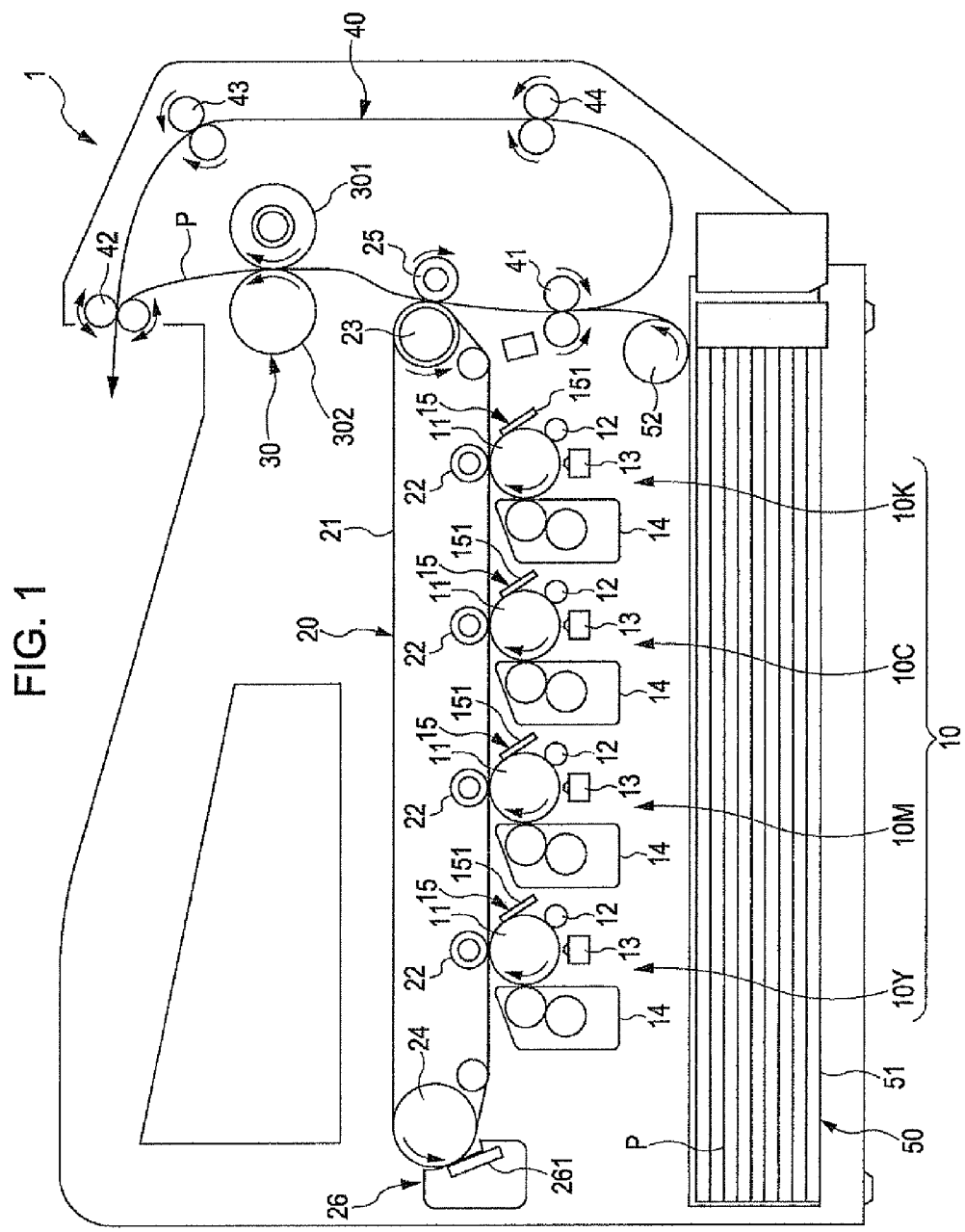
FIG. 1 is a schematic view of the entire structure of an image-forming apparatus according to an embodiment of the invention.
Figure 2:
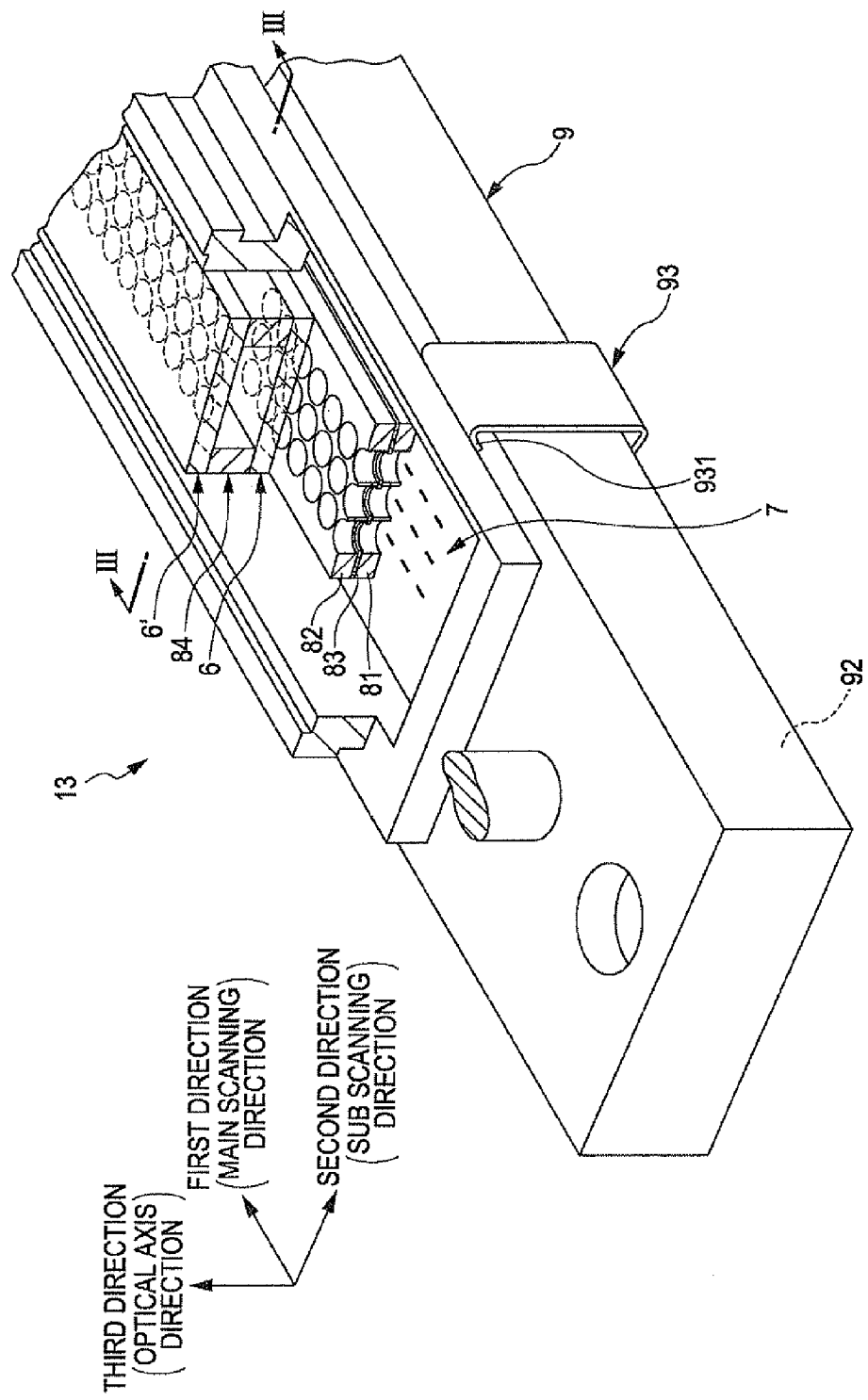
FIG. 2 is a fragmentary perspective view of an exposure head of the image-forming apparatus shown in FIG. 1.
Figure 3:
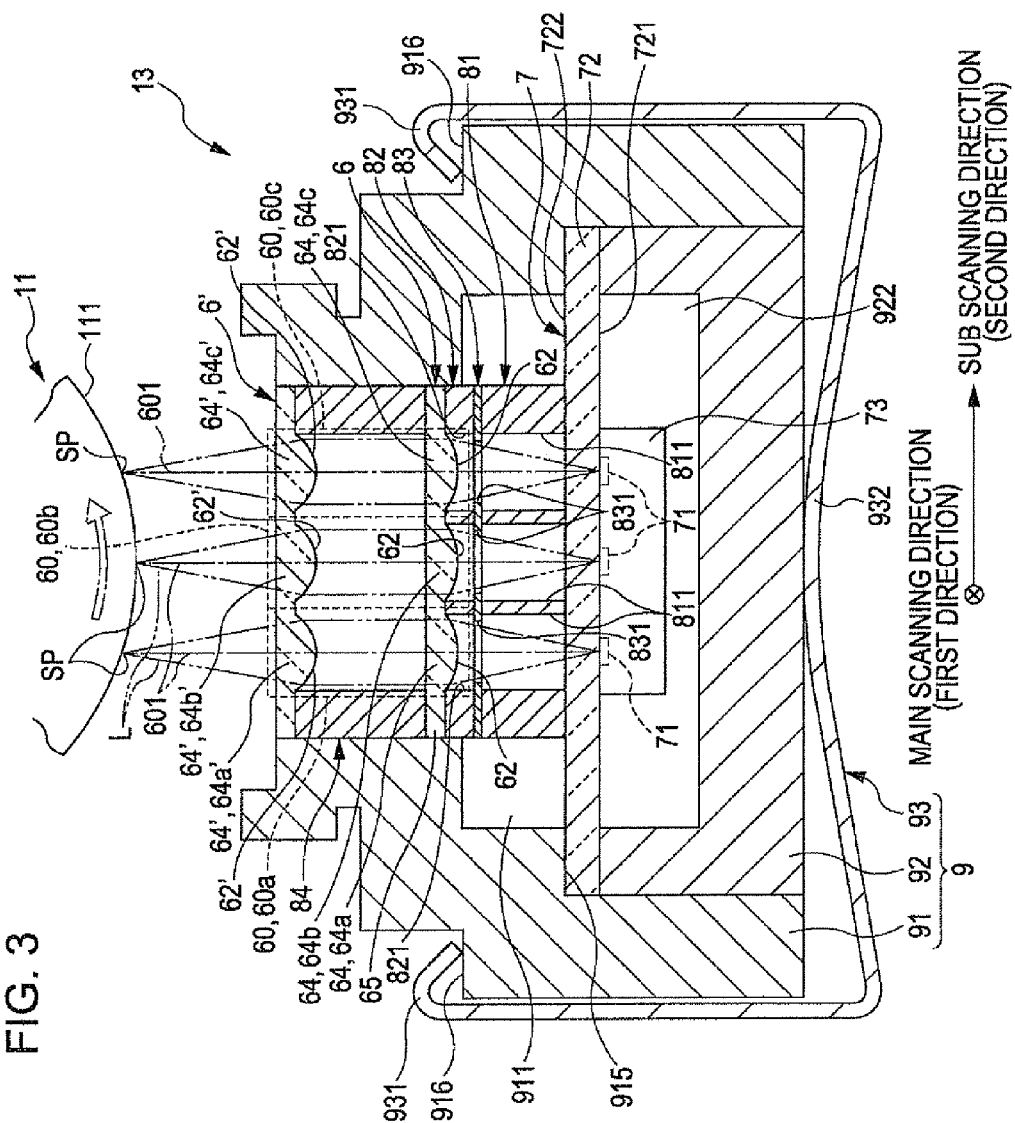
FIG. 3 is a sectional view taken along line in FIG. 2.

FIG. 1 is a schematic view of the entire structure of an image-forming apparatus according to an embodiment of the invention. FIG. 2 is a fragmentary perspective view of an exposure head of the image-forming apparatus shown in FIG. 1. FIG. 3 is a sectional view taken along line III-III in FIG. 2. FIG. 4 is a plan view of the exposure head, showing the positional relation between lenses and light-emitting elements. FIG. 5 is a schematic sectional view of the light-emitting element of the exposure head shown in FIG. 2.

Image-Forming Apparatus

The image-forming apparatus 1 shown in FIG. 1 is an electrophotographic printer that prints images on a recording medium P by an image-forming process including a series of steps, such as charging, exposure, development, transfer, and fixing. The image-forming apparatus 1 of the present embodiment is a so-called tandem color printer.

The image-forming apparatus 1 includes an image-forming unit 10 for the steps of charging, exposure and development, a transfer unit 20 for the transfer step, a fixing unit 30 for the fixing step, a transport mechanism 40 transporting a recording medium P, and a feed unit 50 feeding the recording medium P to the transport mechanism 40, as shown in FIG. 1.

The image-forming unit 10 includes four image-forming stations 10Y, 10M, 10C and 10K forming yellow toner images, magenta toner images, cyan toner images and black toner images, respectively.

The four image-forming stations 10Y, 10C, 10M and 10K each include a photosensitive drum (photoreceptor) 11 acting as a latent image bearing member bearing an electrostatic latent image. Around the periphery of each photosensitive drum 11, a charging unit 12, an exposure head (exposure unit) 13, a developing device 14, a cleaning unit 15 are disposed along the rotational direction of the drum. The image-forming stations 10Y, 10C, 10M and 10K have substantially the same structure as each other except for toner colors used.

The photosensitive drum 11 has a cylindrical shape and rotates on the axis in the direction indicated by an arrow shown in FIG. 1. A photosensitive layer (not shown) made of an organic photoconductor (OPC), amorphous silicon ($\alpha$-Si) or the like is disposed on the periphery of the photosensitive drum 11. The periphery of the photosensitive drum 11 has a photoreceptive surface 111 receiving light L emitted from the exposure head 13 (see FIG. 3).

The charging unit 12 uniformly electrifies the photoreceptive surface 111 of the photosensitive drum 11 by corona charging.

The exposure head 13 receives image information from a host computer (not shown), such as a personal computer, and emits light L to the photoreceptive surface 111 of the photosensitive drum 11 according to the image information. The uniformly charged photoreceptive surface 111 is exposed to the light L to form a latent image (electrostatic latent image) on the photoreceptive surface 111 according to the light exposure pattern. The structure of the exposure head 13 will be described in detail later.

The developing device 14 includes a reservoir (not shown) storing a toner, and feeds the toner from the reservoir to the photoreceptive surface 111 having the electrostatic latent image. The latent image on the photosensitive drum 11 is thus developed into a visible toner image.

The cleaning unit 15 has a rubber cleaning blade 151 coming into contact with the photoreceptive surface 111 of the photosensitive drum 11. The cleaning blade 151 scrapes the toner remaining on the photosensitive drum 11 to remove after a primary transfer described later.

The transfer unit 20 transfers the respective color toner images formed on the photosensitive drums 11 of the image-forming stations 10Y, 10M, 10C and 10K onto a recording medium P at one time.

Each of the four image-forming stations 10Y, 10C, 10M and 10K performs the charging of the photoreceptive surface 111 of the photosensitive drum 11 with the charging unit 12, the exposure of the photoreceptive surface 111 with the exposure head 13, the feed of the toner to the photoreceptive surface 111 with the developing device 14, the primary transfer to an intermediate transfer belt 21 by pressing with a primary transfer roller 22, and the cleaning of the photoreceptive surface 111 with the cleaning unit 15 in that order while the photosensitive drum 11 rotates once.

The transfer unit 20 includes an endless intermediate transfer belt 21 drawn with a plurality (four in FIG. 1) of primary transfer rollers 22, a driving roller 23 and a driven roller 24. The intermediate transfer belt 21 is driven to rotate in the direction of arrows shown in FIG. 1 by the rotation of the driving roller 23 at a peripheral speed substantially equal to that of the photosensitive drum 11.

The primary transfer rollers 22 oppose the respective photosensitive drums 11 with the intermediate transfer belt 21 therebetween, and transfer monochromatic toner images on the photosensitive drums 11 to the intermediate transfer belt 21 (primary transfer). For the primary transfer, a primary transfer voltage (primary transfer bias) having an opposite polarity to the charge of the toner is applied to the primary transfer rollers 22.

At least one of yellow, magenta, cyan and black toner images is borne on the intermediate transfer belt 21. For forming a full color image, for example, a yellow, a magenta, a cyan and a black toner image are transferred one after another onto the intermediate transfer belt 21 to form a full color toner image as an intermediate transfer image.

The transfer unit 20 further includes a secondary transfer roller 25 opposing the driving roller 23 with the intermediate transfer belt 21 therebetween, and a cleaning unit 26 opposing the driven roller 24 with the intermediate transfer belt 21 therebetween.

The secondary transfer roller 25 transfers a monochromatic or full color toner image (intermediate transfer image) formed on the intermediate transfer belt 21 to a recording medium P fed from the feed unit 50, such as paper, a film or cloth (secondary transfer). For the secondary transfer, the secondary transfer roller 25 is pressed on the intermediate transfer belt 21 and a secondary transfer voltage (secondary transfer bias) is applied to the secondary transfer roller 25. The driving roller 23 doubles as a backup roller of the secondary transfer roller 25 for the secondary transfer.

The cleaning unit 26 has a rubber cleaning blade 261 coming in contact with the surface of the intermediate transfer belt 21. The cleaning blade 261 scrapes the toner remaining on the intermediate transfer belt 21 to remove after the secondary transfer.

The fixing unit 30 includes a fixing roller 301 and a pressure roller 302 pressed on the fixing roller 301. The recording medium P passes between the fixing roller 301 and the pressure roller 302. The fixing roller 301 contains a heater for heating the periphery of the fixing roller so as to heat the passing recording medium P while pressing the medium P. Thus, the fixing unit 30 heats and presses the recording medium P on which the secondary transfer of a toner image has been performed so that the toner image is fused and fixed onto the recording medium P to form a permanent image.

The transport mechanism 40 includes a resist roller pair 41 transporting the recording medium P to the secondary transfer portion between the secondary transfer roller 25 and the intermediate transfer belt 21 while controlling timing for feeding the recording medium P, and transport roller pairs 42, 43 and 44 pinching and transporting the recording medium P that has been subjected to fixing by the fixing unit 30.

For forming an image only on one side of the recording medium P, the transport mechanism 40 transports and ejects the recording medium P whose one side has been subjected to fixing by the fixing unit 30 to the outside of the image-forming apparatus 1 with the transport roller pair 42 pinching and transporting the recording medium P. For forming images on both sides of the recording medium P, with the transport roller pair 42 pinching a recording medium P whose one side has been subjected to fixing by the fixing unit 30, the transport roller pair 42 is driven in the opposite direction while the transport roller pairs 43 and 44 are driven so that the recording medium P is turned over and returned to the resist roller pair 41. Thus an image is formed on the other side of the recording medium P in the same manner as above.

The feed unit 50 includes a media feed cassette 51 accommodating virgin recording media P and a pickup roller 52 delivering the recording media P one after another from the media feed cassette 51 to the resist roller pair 41.

Exposure Head

The exposure head 13 will now be described in detail. In the following description, the direction of the axis of the photosensitive drum 11 is referred to as the main scanning direction (first direction), and the direction in which the portion of the photoreceptive surface 111 of the photosensitive drum 11 opposing the exposure head 13 moves is referred to as the sub scanning direction (second direction), for convenience sake.

The exposure head 13 opposes the photoreceptive surface 111 of the photosensitive drum 11. The exposure head 13 includes a first lens array 6', a spacer 84, a second lens array 6, a first light-shielding member 82, a throttle member (aperture throttle) 83, a second light-shielding member 81, and light-emitting element array 7. These members are housed in a case 9. In the exposure head 13, light L emitted from the light-emitting element array 7 is reduced by the throttle member 83, and is then irradiates the photoreceptive surface 111 of the photosensitive drum 11 through the second lens array 6 and the first lens array 6' in that order.

As shown in FIG. 2, the lens arrays 6 and 6' are each made of a long plate. As shown in FIG. 3, the lower surface (light incident side) of the second lens array 6 through which light L enters is formed into a plurality of lens surfaces (convex surfaces) 62. The upper surface (light emitting side) of the second lens array 6 through which the light L is emitted has a flat surface. Thus, the second lens array 6 has a plurality of planoconvex lenses 64, each having a convex surface on the light incident side and a flat surface on the light emitting side. The region of the second lens array 6 other than the region defining the lenses 64 acts as a support portion 65 supporting the lenses 64.

Similarly, the lower surface (light incident side) of the first lens array 6' is formed into a plurality of lens surfaces (convex surfaces) 62' corresponding to the lenses 62 of the second lens array 6. The upper surface (light emitting side) of the first lens array 6' has a flat surface. Thus, the first lens array 6' has a plurality of planoconvex lenses 64', each having a convex surface on the light incident side and a flat surface on the light emitting side. The region of the first lens array 6' other than the region defining the lenses 64' acts as a support portion 65' supporting the lenses 64'.

Each pair of the opposing lenses 64 and 64' defines an imaging optical system 60 that focuses light emitted from light-emitting elements 74 of the corresponding light-emitting element group 71.

The arrangement of the lenses 64 of the second lens array 6 will now be described. The arrangement in plan view of the lenses 64' of the first lens array 6' is the same as that of the lenses 64 of the second lens array 6, and the same description is not repeated.

As shown in FIG. 4, a plurality of lines of the lenses 64 are arranged in the main scanning direction (first direction), and a plurality of rows of the lenses 64 are arranged in the sub scanning direction (second direction), which is perpendicular to the main scanning direction and the optical axis direction of the lenses 64.

More specifically, the lenses 64 are arranged substantially in a matrix of three rows by n columns (n represents an integer of 2 or more). In the following description, the middle lens 64 of the three lenses 64 in one column (lens column) is referred to as lens 64*b*; the lens to the left of the middle lens 64*b* in FIG. 3 (above the middle lens 64 in FIG. 4) is referred to as lens 64*a*; and the lens to the right of the middle lens 64*b* in FIG. 3 (below the middle lens 64 in FIG. 4) is referred to as lens 64c. As for the lenses 64' of the first lens array 6', the lens 64' corresponding to the lens 64a is referred to as lens 64a'; the lens 64' corresponding to the lens 64b is referred to as lens 64b'; and the lens 64 corresponding to the lens 64c is referred to as lens 64c'.

In the present embodiment, the exposure head 13 is disposed in the image-forming apparatus 1 in such a manner that the lens 64b closest to the center of the sub scanning direction of the lenses 64 (64a to 64c) in the lens column is located closest to the photoreceptive surface 111 of the photosensitive drum 11. This arrangement is facilitates the control of the optical properties of the lenses 64.

The lenses 64a to 64c in each lens column may be staggered one after another in the main scanning direction (rightward in FIG. 4) at regular intervals, as shown in FIG. 4. In other words, the line passing through the center of the lenses 64a to 64c in the lens column may form angles with the main scanning direction and the sub scanning direction.

In the sectional view of FIG. 3, the lenses 64a and 64c of the three lenses 64 (64a to 64c) in the lens column are disposed in such a manner that their optical axes 601 are symmetrical to each other with respect to the optical axis 601 of the lens 64b. Also, the optical axes 601 of the lenses 64a to 64c are parallel to each other.

The lens arrays 6 and 6' may be made of any material without particular limitation as long as desired optical characteristics can be provided, and, can be made of, for example, a resin and/or glass.

The first lens array 6' and the second lens array 6 are separated by the spacer 84, as shown in FIGS. 2 and 3. The lens arrays 6 and 6' are joined with the spacer 84 therebetween. The spacer 84 defines a gap length, or distance between the lens arrays 6 and 6'. By controlling the thickness of the spacer 84, the distance between the lenses 64 of the second lens array 6 and the lenses 64' of the first lens array 6' can be set as desired.

The spacer 84 may be of a frame corresponding to the outer regions of the first and second lens arrays 6' and 6 and is bonded to these outer regions. The spacer 84 may have any shape without being limited to a frame as long as it can serve as desired. For example, the spacer 84 may include a pair of opposing members, each corresponding to only one side of the outer regions of the lens arrays 6 and 6', or may be in a plate form having through holes corresponding to the optical paths as in the light-shielding members 81 and 83.

The spacer 84 may be made of any material without particular limitation as long as it can serve as desired, and can be made of, for example, a resin, a metal, a glass or a ceramic.

The light-emitting element array 7 is disposed at the light incident side of the lens array 6 with the first light-shielding member 82, the throttle member 83 and the second light-shielding member 81 therebetween, as shown in FIG. 3. The light-emitting element array 7 includes a plurality of light-emitting element groups 71 and a support (head substrate) 72. The support 72 supports the light-emitting element groups 71 and is made of a long plate. The support 72 is disposed parallel to the second lens array 6.

Although the material of the support 72 is not particularly limited, it is preferable that the support 72 be made of a transparent material, such as glass or plastic, if the light-emitting element groups 71 are disposed on the rear surface of the support 72 (if the light-emitting elements 74 are of bottom emission type). If the light-emitting elements 74 are of top emission type, the support 72 is not necessarily transparent, and may be made of, for example, a metal, such as aluminum or stainless steel, glass, or plastic singly or in combination. A glass or metal support 72 can efficiently dissipate heat generated by light emission of the light-emitting elements 74. The use of a plastic contributes to reduction of the weight of the support 72.

The support 72 is provided with a box 73 open to the support 72 side at the rear surface thereof. The box 73 accommodates the light-emitting element groups 71, conductors (not shown) electrically connected to the light-emitting element groups 71 (or light-emitting elements 74), or a circuit (not shown) driving the light-emitting elements 74.

The light-emitting element groups 71 are arranged substantially in a matrix of three rows by n columns (n represents an integer of 2 or more) with a distance from each other, corresponding to the lenses 64, as shown in FIG. 4. Each light-emitting element group 71 includes a plurality of light-emitting elements 74 (8 elements in the present embodiment). The 8 light-emitting elements 74 in the light-emitting element group 71 are arranged along the lower surface 721 of the support 72, as shown in FIG. 3. The light L emitted from the 8 light-emitting elements 74 is focused on the photoreceptive surface 111 of the photosensitive drum 11 through the corresponding lens 64.

The 8 light-emitting elements 74 are disposed with a distance from each other in four columns arranged in the main scanning direction, and in two rows arranged in the sub scanning direction, as shown in FIG. 4. The 8 light-emitting elements 74 are thus arranged substantially in a matrix of two rows by four columns. The two adjacent light-emitting elements 74 in each column (light-emitting element column) are staggered in the main scanning direction from each other. The 8 light-emitting elements 74 in a matrix of two rows by four columns are arranged in such a manner that the intervals between the light-emitting elements 74 in one row extending in the main scanning direction are compensated with the light-emitting elements 74 in the adjacent row.

It is limited to arrange 8 light-emitting elements 74 in a row as close as possible. By arranging the 8 light-emitting elements 74 in a staggered manner as described above, however, the light-emitting elements 74 can be more closely disposed. Consequently, images can be formed on the recording medium P with a higher recording density. Consequently, a high-resolution, clear image having a larger number of steps of gradation can be formed on the recording medium P.

Although the 8 light-emitting elements 74 in the light-emitting element group 71 are arranged substantially in a matrix of two rows by four columns in the present embodiment, the arrangement is not limited to such a matrix and may be, for example, in a matrix of 4 rows by two columns.

The light-emitting element groups 71 are arranged substantially in a matrix of three rows by n columns with a distance from each other. The three light-emitting element groups 71 in each column (light-emitting element group column) are staggered in the main scanning direction (rightward) at regular intervals, as shown in FIG. 4. The light-emitting element groups 71 substantially in a matrix of three rows by n columns are arranged in such a manner that the intervals between the light-emitting element groups 71 in one row are compensated with the light-emitting element groups 71 in the adjacent row.

It is limited to arrange the light-emitting element groups 71 in a row as close as possible. By arranging the light-emitting element groups 71 in a staggered manner as described above, however, the light-emitting element groups 741 can be more closely disposed. Thus, combination of this arrangement of the light-emitting element groups 71 and the staggered arrangement of the 8 light-emitting elements 74 in each light-emitting element group 71 can increase the recording density of images formed on the recording medium P. Accordingly, a high-resolution, clear image having a larger number of steps of gradation and color reproductivity can be formed on the recording medium P. The light-emitting element 74 is a bottom emission organic electroluminescent element (organic EL element). However, the light-emitting element 74 is not limited to the bottom emission type and may be of top emission type. The top emission type does not require that the support 72 be optically transparent.

Use of organic EL elements as the light-emitting elements 74 allows the elements to be arranged at relatively small intervals. Consequently, images can be formed on the recording medium P with a relatively high recording density. In addition, organic EL elements can be formed precisely in size and position by various methods. Thus, the recording medium P can have clearer images.

Each light-emitting element 74 of the present embodiment emits red light. The detailed structure of the light-emitting element 74 will be described later.

The first light-shielding member 82, the throttle member 83 and the second light-shielding member 81 are disposed between the second lens array 6 and the light-emitting element array 7, as shown in FIG. 3.

The light-shielding members 81 and 82 each prevent the cross talk of light L between adjacent light-emitting element groups 71. The second light-shielding member 81 has through holes (apertures) 811 passing through the thickness thereof. The through holes 811 are formed corresponding to the positions of the lenses 64.

Similarly, the first light-shielding member 82 has through holes (apertures) 821 passing through the thickness thereof. The through holes 821 are formed corresponding to the positions of the lenses 64.

The through holes 811 and 821 define optical paths from the light-emitting element groups 71 to their respective lenses 64. The through holes 811 and 821 each have a circular shape and surround the 8 light-emitting elements 74 of the respective light-emitting element groups 71 when viewed from above.

The through holes 811 and 821 shown in FIG. 3 are cylindrical, but are not limited to this shape. For example, the through holes 811 and 821 may have a frustum shape of a cone diverging upward.

These light-shielding members 81 and 82 are separated by the throttle member 83. The throttle member 83 controls the light L entering the lenses 64 from the light-emitting element groups 71 to a predetermined amount. In particular, the throttle member 83 is disposed about the front focal plane of the imaging optical system 60. Thus, the imaging optical system 60 becomes image-side telecentric, and consequently, the respective images of the light-emitting elements 74 can be prevented from being misaligned even if the distance between the photoreceptive surface 111 and the exposure head 13 has an error, such as fitting error.

The throttle member 83 is in a plate or layer form and has through holes (apertures) 831 passing thorough the thickness thereof. The through holes 831 are formed corresponding to the positions of the lenses 64 (that is, the positions of the above-described through holes 811 and 821 in the light-shielding members). The through holes 831 of the throttle member 83 have a circular shape when viewed from above and their diameter is smaller than that of the through holes 811 and 821 of the light-shielding members 81 and 82.

The light-shielding members 81 and 82 and the throttle member 83 precisely determine the distance between the second lens array 6 and the support 72, and their positional relation and postures.

The distance between the lens surface 62 of the lens 64 and the corresponding light-emitting element group 71 is an important factor for determining the imaging position of the imaging optical system 60 in the vertical direction in FIG. 3.

By using the light-shielding members 81 and 82 and the throttle member 83 as a spacer defining the distance between the second lens array 6 and the light-emitting element array 7, that is, the gap length, a highly precise and reliable image-forming apparatus 1 can be provided.

Preferably, at least the inner walls of the light-shielding members 81 and 82 and throttle member 83 have a dark color, such as black, dark brown or dark blue.

The light-shielding members 81 and 82 and throttle member 83 can be made of any optically opaque material. For example, these members may be made of a metal-base material, such as chromium or chromium oxide, or a resin containing carbon black or a coloring agent.

The lens arrays 6 and 6', the light-emitting element array 7, the spacer 84, the light-shielding members 81 and 82 and the throttle member 83 are accommodated in the case 9 together, as shown in FIGS. 2 and 3. The case 9 includes a frame (body) 91, a rear cover 92, and a plurality of clamps 93 securing the cover 92 to the frame 91, as shown in FIG. 3.

The frame 91 is a long member as shown in FIG. 2. The frame 91 has a bore 911 open at both ends as shown in FIG. 3. The width of the bore 911 is reduced upward step by step as shown in FIG. 3.

The bore 911 encloses the first lens array 6', the spacer 84, the second lens array 6, the first light-shielding member 82, the throttle member 83, the second light-shielding member 81 and the light-emitting element array 7 together, and these members may be fixed, for example, with an adhesive. Thus, the first lens array 6', the spacer 84, the second lens array 6, the first light-shielding member 82, the throttle member 83, the second light-shielding member 81 and the light-emitting element array 7 are held together by the frame 91, so that the positions of these members are determined in the main scanning direction and the sub scanning direction.

The upper surface 722 of the support 72 of the light-emitting element array 7 abuts against a stepped portion 915 formed in the inner wall of the bore 911 and the lower surface of the second light-shielding member 81. The cover 92 is fitted in the bore 911 from below.

The cover 92 is a long member having a recess 922 in which the box 73 is disposed. The top surface 915 of the cover 92 and the stepped portion 915 of the frame 91 pinch the support 72 of the light-emitting element array 7 therebetween. In addition, the cover 92 is pressed upward by the clamps 93. The cover 92 is thus secured in the frame 91. Furthermore, the pressed cover 92 fixes the positions of the light-emitting element array 7, the light-shielding members 81 and 82, the throttle member 83 and the second lens array 6 in the main scanning direction, the sub scanning direction, and the vertical direction in FIG. 3.

Preferably, the clamps 93 are disposed at regular intervals in the main scanning direction. Thus the frame 91 and the cover 92 can be held uniformly along the main scanning direction. The clamp 93 is formed by bending a metal plate. The clamp 93 has claws 931 at both ends (at the right end and the left end in FIG. 3), and each claw 931 is hooked on the shoulder 916 of the frame 91.

The middle portion of the clamp 93 is bent upward to form an arch 932. The top of the arch 932 presses the bottom surface of the cover 92 and is thus in contact with the bottom surface with the claws hooked on the shoulder 916. The arch 932 is thus elastically deformed to press the cover 92 upward.

If the clamps 93 securing the frame 91 and the cover 92 are removed, the cover 92 can be removed from the frame 91. The maintenance of the light-emitting element array 7, such as replacement and repair, can be thus performed.

The frame 91 and the cover 92 can be made of any material without particular limitation. For example, the same material as the support 72 may be used. Also, the clamps 93 can be made of any material without particular limitation. For example, aluminum or stainless steel may be used. The clamps 93 may be made of a hard resin.

The frame 91 has spacers (not shown) protruding upward at both ends in the longitudinal direction thereof. These spacers define the distance between the photoreceptive surface 111 and the first lens array 6'.

Light-Emitting Element

The light-emitting element 74 will now be described in detail. FIG. 5 shows a light-emitting element (electroluminescent element) 74 emitting red light. The light-emitting element 74 includes an anode 741, a hole injection layer 742, a hole transport layer 743, a luminescent layer (red luminescent layer) 744, a second electron transport layer 745, a first electron transport layer 746, an electron injection layer 747, and a cathode 748 in that order from below.

In other words, the light-emitting element 74 has a multilayer composite 749 including a hole injection layer 742, a hole transport layer 743, a luminescent layer 744, a second electron transport layer 745, a first electron transport layer 746 and an electron injection layer 747 in that order in the direction from the anode 741 to the cathode 748 between the two electrodes (anode 741 and cathode 748). The entirety of the light-emitting element 74 is disposed on the support 72 and sealed with a sealing member 75.

In the light-emitting element 74, the luminescent layer 744 receives electrons supplied (injected) from the cathode 748 and holes supplied (injected) from the anode 741. The holes and the electrons are recombined in the luminescent layer 744. The energy generated by the recombination forms excitons. When the excitons return to the ground state, the energy is emitted as light (fluorescence or phosphorescence). The light-emitting element 74 thus emits red light.

In particular, the two electron transport layers (first electron transport layer 746 and second electron transport layer 745) prevent holes having passed through the luminescent layer 744 from the anode 741 toward the cathode 748 from further transferring closer to the cathode 748 even if a high current is applied between the cathode 748 and the anode 741. Accordingly, even if the luminescent layer emits red light with high luminance, the light-emitting element 74 can be prevented from deteriorating to enhance the lifetime thereof.

Members constituting the light-emitting element 74 will be described below.

Anode

The anode 741 is an electrode injecting holes to the hole transport layer 743 through the below-described hole injection layer 742. Preferably, the anode 741 is made of a material having a high work function and a high conductivity.

Exemplary anode materials include oxides, such as indium tin oxide (ITO), indium zinc oxide (IZO), $In_2O_3$, $SnO_2$, Sb-containing $SnO_2$, and Al-containing ZnO; metals, such as Au, Pt, Ag, Cu, and alloys containing these metals. These materials may be used singly or in combination.

The anode 741 preferably has a thickness of, but not limited to, about 10 to 200 nm on average, more preferably about 50 to 150 nm.

Cathode

The cathode 748 is an electrode injecting electrons to the first electron transport layer 746 through the below-described electron injection layer 747. Preferably, the cathode 748 is made of a material having a low work function. Exemplary cathode materials include metals such as Li, Mg, Ca, Sr, La, Ce, Er, Eu, Sc, Y, Yb, Ag, Cu, Al, Cs, Rb, and alloys containing these metals. At least one of these materials may be used to form a single-layer or a multilayer cathode.

For forming an alloy cathode 748, suitable alloys contain a stable metallic element, such as Ag, Al or Cu. Such alloys include, for example, MgAg, AlLi and CuLi. These alloys can enhance the electron injection efficiency and stability of the resulting cathode 748.

The cathode 748 preferably has a thickness of, but not limited to, about 100 to 10,000 nm on average, more preferably about 100 to 500 nm.

Since the light-emitting element 74 of the present embodiment is of bottom emission type, the cathode 748 is not necessarily optically transparent.

Hole Injection Layer

The hole injection layer 742 enhances the efficiency of hole injection from the anode 741. The hole injection layer 742 can be made of any hole injection material. Exemplary hole injection materials include amine compounds such as the compound expressed by formula (1) (N,N,N',N'-tetraphenyl-p-diaminobenzene) and its derivatives. These compounds may be used singly or in combination.

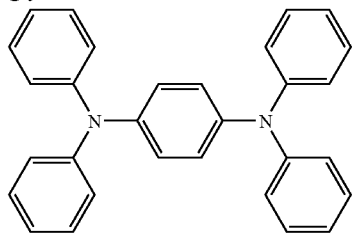

(1)

Exemplary derivatives of the compound expressed by formula (1) include the compounds expressed by the following formulas (2) to (10):

(2)

(3)

-continued
(4)
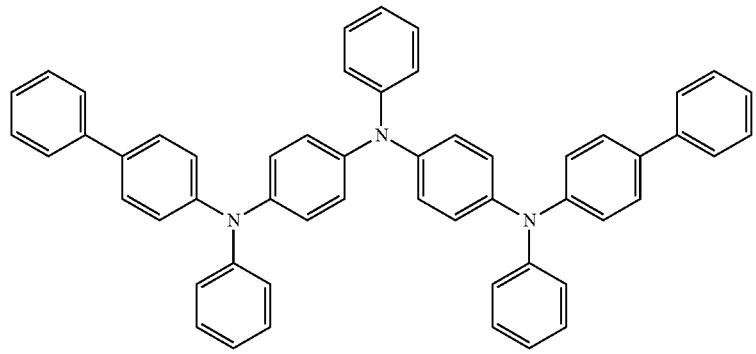
(5)
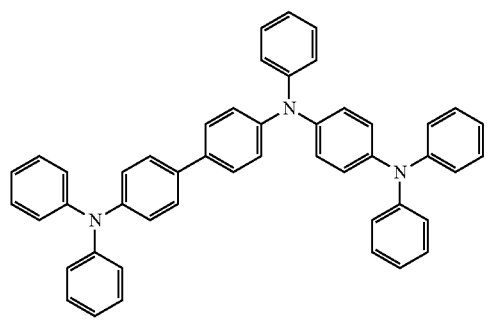
(6)
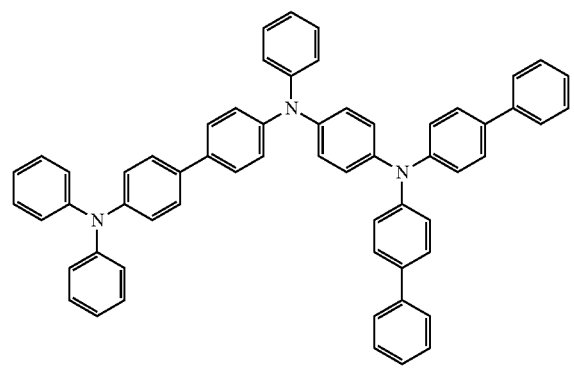
(7)
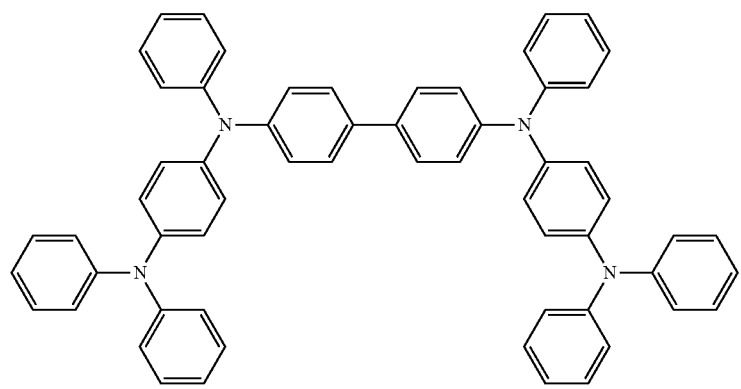
(8)
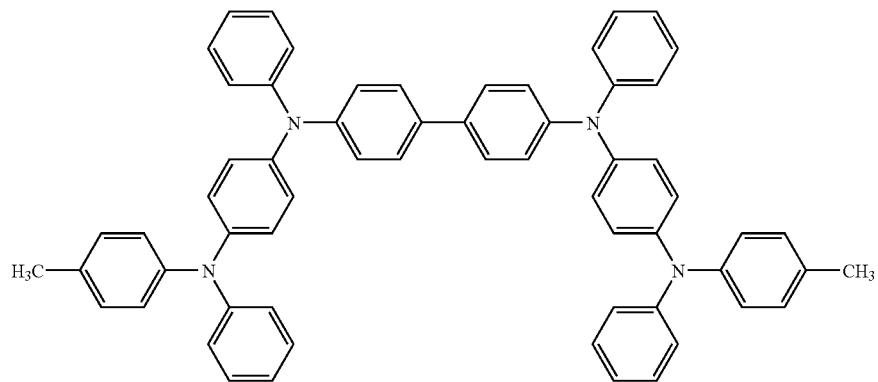

-continued

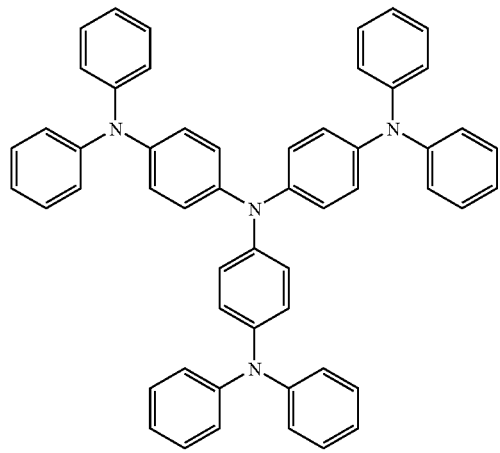
(9)

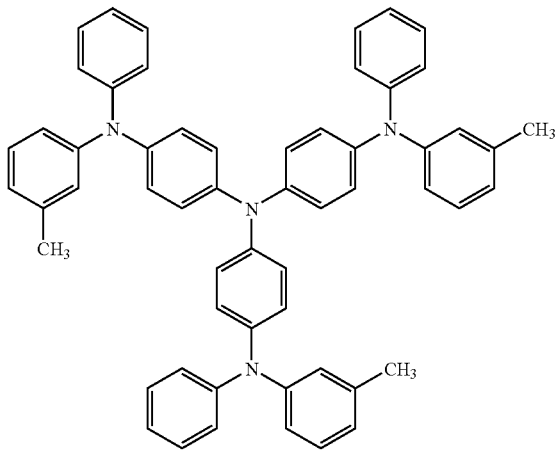
(10)

The hole injection layer 742 preferably has a thickness of, but not limited to, about 5 to 150 nm on average, more preferably about 10 to 100 nm.

The hole injection layer 742 may be omitted.

Hole Transport Layer

The hole transport layer 743 transports the holes injected through the hole injection layer 742 from the anode 741 to the luminescent layer 744. The hole transport layer 743 can be made of any material. Exemplary hole transport layer materials include amine compounds such as the compound expressed by formula II (N,N,N',N'-tetraphenylbenzidine) and its derivatives. These compounds may be used singly or in combination.

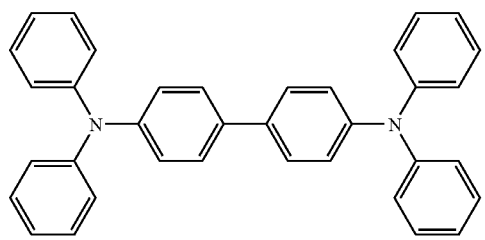
(11)

Exemplary derivatives of the compound expressed by formula (11) include the compounds expressed by the following formulas (12) to (16):

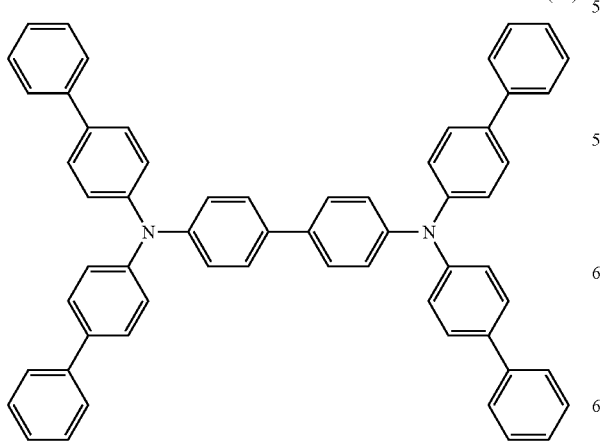
(12)

-continued

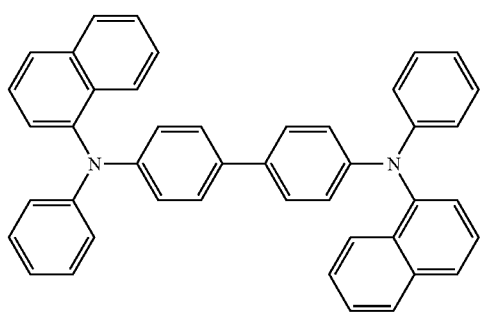
(13)

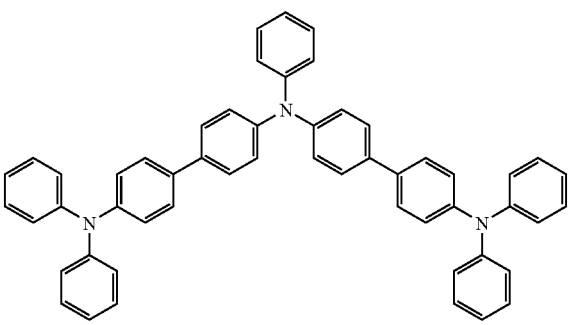
(14)

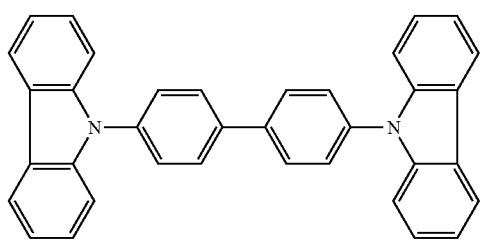
(15)

(16)

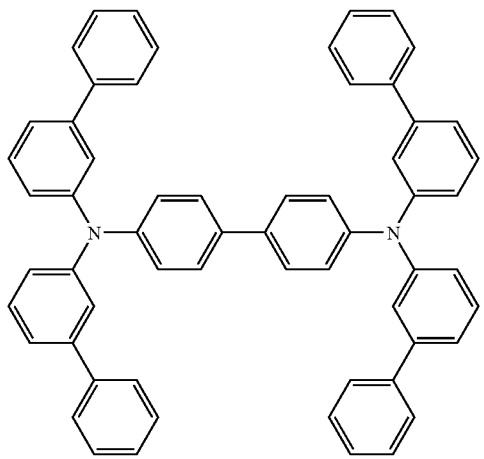

The hole transport layer 743 preferably has a thickness of, but not limited to, about 10 to 150 nm on average, more preferably about 10 to 100 nm.

The hole transport layer 743 may be omitted.

Luminescent Layer

The luminescent layer 744 contains a red luminescent material emitting red light having a peak wavelength in a region of 600 nm or more. Any red luminescent material can be used without particular limitation. At least one of red fluorescent materials and red phosphorescent materials may be used singly or in combination.

Exemplary red fluorescent materials include perylene derivatives such as diindenoperylene derivatives as expressed by formula (17), europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizine-9-yl)ethenyl)-4H-pyran-4H-ylidene)propane-dinitrile (DCJTB), and 4-(dicyanomethylene)-2-methyl-6-(p-dimethylaminostyryl)-4H-pyran (DCM). Any material may be used as long as emitting red fluorescence.

Among those, preferred are diindenoperylene derivatives. The use of a diindenoperylene derivative allows the luminescent layer 744 to emit red light with high luminance.

Exemplary red phosphorescent materials include metal complexes, such as of iridium, ruthenium, platinum, osmium, rhenium, and palladium, and any material may be used as long as emitting red phosphorescence. At least one of the ligands of the metal complex may have a phenylpyridine skeleton, a bipyridyl skeleton, a porphyrin skeleton or the like. For example, such materials include tris(1-phenylisoquinoline)iridium, bis[2-(2'-benzo[4,5-α]thienyl)pyridinato-N,$C^{3'}$]iridium (acetylacetonate) (btp 2Ir (acac)), 2,3,7,8,12,13,17,18-octaethyl-12H,23H-porphyrin-platinum (II), bis[2-(2'-benzo[4,5-α]thienyl)pyridinato-N,$C^{3'}$]iridium, and bis(2-phenylpyridine)iridium(acetylacetonate).

The luminescent layer 744 may further contain a host material of the red luminescent material. The host material helps the recombination of holes and electrons to form excitons, and transfers the energy of the excitons to the red luminescent material (Ferster transfer or Dexter transfer) to excite the red luminescent material. For use of such a host material, for example, the host material may be doped with the guest material or red luminescent material.

Any material having the above-mentioned functions can be used without particular limitation. Exemplary red fluorescent materials include naphthacene derivatives as expressed by formula (18), distyrylarylene derivatives, perylene derivatives, distyrylbenzene derivatives, distyrylamine derivatives, quinolinolate metal complexes such as tris(8-quinolinolate) aluminum complex ($Alq_3$), triarylamine derivatives such as tetrameric trisphenylamine, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi). These compounds may be used singly or in combination.

(17)

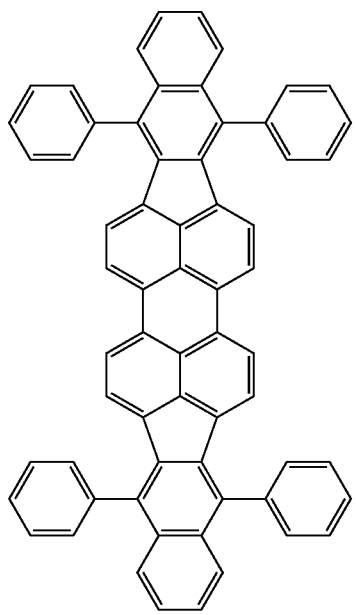

(18)

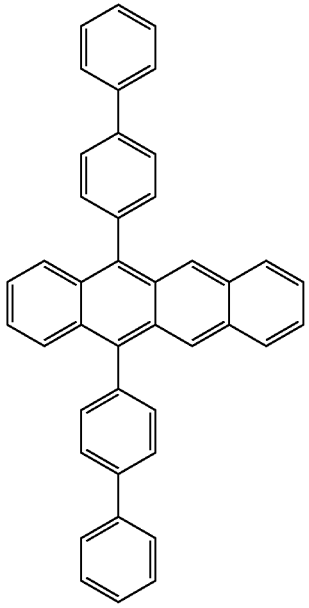

Among those, preferred are naphthacene derivatives. In particular, in use of a diindeno perylene derivative as the red luminescent material, the use of a naphthacene derivative in the luminescent layer 744 allows the resulting luminescent layer 744 to emit red light having higher luminance more efficiently.

Exemplary red phosphorescent materials used as the host material include carbazole derivatives, such as 3-phenyl-4-(1'-naphthyl)-5-phenylcarbazole and 4,4'-N,N'-dicarbazolebiphenyl (CBP). These compounds may be used singly or in combination.

If the luminescent layer 744 contains a red luminescent material (guest material) and a host material, the red luminescent material content (amount of doping luminescent material) in the luminescent layer 744 is preferably 0.01% to 10% by weight, more preferably 0.1% to 5% by weight. By controlling the red luminescent material content in such ranges, the luminous efficiency can be optimized.

The luminescent layer 744 preferably has a thickness of, but not limited to, about 10 to 150 nm on average, more preferably about 10 to 100 nm.

First Electron Transport Layer

The first electron transport layer 746 transports electrons injected through the electron injection layer 747 from the cathode 748 to the second electron transport layer 745. The first electron transport layer 746 contains a first electron transport material.

Exemplary first electron transport materials include amine materials (phenanthroline derivatives) such as bathophenanthroline (Bphen) expressed by formula (19), quinoline derivatives such as metal complexes containing 8-quinolinol or its derivative as a ligand, for example, tris(8-quinolinolate) aluminum (Alq$_3$) expressed by formula (20), oxadiazole derivatives, perylene derivatives, pyridine derivatives, pyrimidine derivatives, quinoxaline derivatives, diphenylquinone derivatives, and nitro-substituted fluorene derivatives. These compounds may be used singly or in combination.

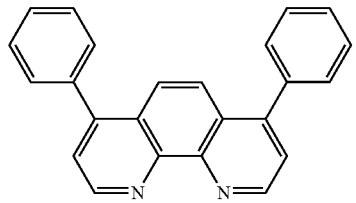

(19)

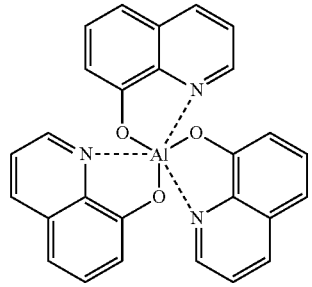

(20)

Preferably, the first electron transport material has a higher electron transport ability than the material of the below-described second electron transport layer 745. Such a first electron transport layer 746 can smoothly transport electrons from the cathode 748 to the luminescent layer 744 even if the electron transport ability of the material of the second electron transport layer 745 is low.

Accordingly, it is preferable that the first electron transport layer 746 contain a phenanthroline derivative. Such a first electron transport layer 746 can be superior in electron transport ability. Consequently, the luminous efficiency of the light-emitting element 74 can be enhanced.

The first electron transport layer 746 preferably has a thickness of, but not limited to, about 8 to 80 nm on average, more preferably about 10 to 50 nm.

Second Electron Transport Layer

The second electron transport layer 745 transports electrons injected from the first electron transport layer 746 to the luminescent layer 744. The second electron transport layer 745 is in contact with the luminescent layer 744 and the first electron transport layer 746 between these layers.

The second electron transport layer 745 contains a second electron transport material different from the first electron transport material of the first electron transport layer 746. Any material may be used as the second electron transport material as long as it can transport electrons and is different from the first electron transport material, and the second electron transport material can be selected from the materials listed as examples of the first electron transport material.

Preferably, the second electron transport layer 745 is superior to the first electron transport layer 746 in capturing holes. Such a second electron transport layer 745 can capture holes to prevent the holes from transferring toward the cathode 748.

In this instance, preferably, the second electron transport material is more resistant to holes than the first electron transport material. Thus, the second electron transport layer 745 can be prevented from deteriorating or altering.

Accordingly, it is preferable that the second electron transport layer 745 mainly contain the compound (Alq$_3$) expressed by formula (20). Alq$_3$ can capture holes. Accordingly, the second electron transport layer 745 containing Alq$_3$ can capture holes having passed through the luminescent layer 744 from the anode 741 toward the cathode 748. Thus, the holes can be prevented from further transferring closer to the cathode 748 (to the first electron transport layer 746) effectively.

If the second electron transport layer 745 contains Alq$_3$, it is preferable that the second electron transport layer 745 further contain a rubrene derivative as expressed by formula (21):

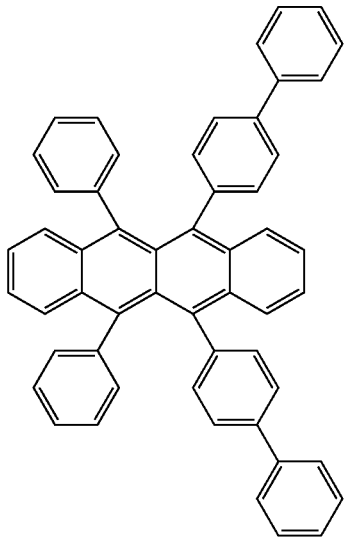

(21)

Rubrene derivatives can convert holes to heat or light. Accordingly, in the second electron transport layer 745 containing Alq₃ and, in addition, a rubrene derivative, the rubrene derivative can convert holes captured by the Alq₃ to heat or light. Consequently, the second electron transport layer 745 (Alq₃) can be prevented from deteriorating or altering, and eventually, the lifetime of the light-emitting element 74 can be enhanced.

If electrons and holes are recombined in the second electron transport layer 745, the rubrene derivative in the second electron transport layer 745 can emit light. However, the luminescence of the rubrene derivative has so low a luminance that it cannot be measured or cause a problem even in use as an exposure head.

Preferably, the rubrene derivative content in the second electron transport layer 745 is in the range of 0.5% to 20% by weight, more preferably in the range of 1% to 10% by weight, and still more preferably in the range of 2% to 5% by weight. Such a second electron transport layer 745 can reduce the driving voltage and increase the lifetime of the light-emitting element 74.

On the other hand, if the rubrene derivative content in the second electron transport layer 745 is lower than the above ranges, the effect of the rubrene derivative to increase the lifetime of the light-emitting element 74 may not be produced. In contrast, if the rubrene derivative content is higher than the above ranges, the voltage for driving the light-emitting element 74 may be increased to reduce the lifetime of the light-emitting element 74, depending on the thicknesses or materials of the layers constituting the light-emitting element 74.

When the second electron transport layer 745 has a thickness of A nm and the first electron transport layer 746 has a thickness of B nm, preferably, these thicknesses satisfy the relationship $10\% \leq A/B < 90\%$, more preferably $10\% \leq A/B < 50\%$, and still more preferably $10\% \leq A/B < 40\%$. Such a relationship can reduce the driving voltage and increase the lifetime of the light-emitting element 74.

On the other hand, if A/B is smaller than the above ranges, the formation of the second electron transport layer 745 may become difficult depending on the thickness of the first electron transport layer 745, the effect of the second electron transport layer 745 (for example, to capture holes) cannot be produced, or the lifetime of the light-emitting element 74 may be reduced. In contrast, if A/B is larger than the above ranges, the voltage for driving the light-emitting element 74 may be increased to reduce the lifetime of the light-emitting element 74, depending on the thickness of the first electron transport layer 746.

Preferably, the second electron transport layer 745 has a thickness in the range of 2 to 15 nm, more preferably in the range of 2 to 10 nm, and still more preferably in the range of 5 to 8 nm. Such a second electron transport layer 745 can reduce the driving voltage and increase the lifetime of the light-emitting element 74.

On the other hand, if the thickness of the second electron transport layer 745 is smaller than the above ranges, the formation of the second electron transport layer 745 may become difficult, the effect of the second electron transport layer 745 (for example, to capture holes) cannot be produced, or the lifetime of the light-emitting element 74 may be reduced. In contrast, if the thickness of the second electron transport layer 745 is larger than the above ranges, the voltage for driving the light-emitting element 74 may be increased to reduce the lifetime of the light-emitting element 74.

Preferably, the total thickness of the first electron transport layer 746 and the second electron transport layer 745 is in the range of 10 to 100 nm, and more preferably in the range of 15 to 50 nm. Such thicknesses of the first and second electron transport layers can reduce the driving voltage and increase the lifetime of the light-emitting element 74.

On the other hand, if the total thickness is smaller than the above ranges, the formation of the second electron transport layer 745 may become difficult, the effect of the second electron transport layer 745 (for example, to capture holes) cannot be produced, or the lifetime of the light-emitting element 74 may be reduced. In contrast, if the total thickness is larger than the above ranges, the voltage for driving the light-emitting element 74 may be increased to reduce the lifetime of the light-emitting element 74.

For the sake of convenience, FIG. 5 clearly shows the interface between the first electron transport layer 746 and the second electron transport layer 745. It is however preferable that the materials of the first and the second electron transport layer be mixed in the vicinity of their interface. Such a structure facilitates the transfer of electrons from the first electron transport layer 746 to the second electron transport layer 745. Consequently, the luminous efficiency of the light-emitting element 74 can be enhanced.

In this instance, the first and the second electron transport material in the mixed portion may be controlled so that the content of the first electron transport material can be gradually reduced and the content of the second electron transport material can be gradually increased, form the first electron transport layer 746 to the second electron transport layer 745.

Electron Injection Layer

The electron injection layer 747 enhances the efficiency of electron injection from the cathode 748. The electron injection layer 747 can be made of an inorganic insulating material or an inorganic semiconductor material (electron transport material).

Exemplary inorganic insulating materials include alkali metal chalcogenides (oxides, sulfides, selenides, tellurides), alkaline-earth metal chalcogenides, alkali metal halides and alkaline-earth metal halides. These materials may be used singly or in combination. The electron injection layer 747 mainly containing such an inorganic insulating material can exhibit higher electron injection ability. In particular, alkali metal compounds (such as alkali metal chalcogenides and alkali metal halides) have very low work function. The use of such a material for the electron injection layer 747 allows the light-emitting element 74 to emit light with high luminance.

Exemplary alkali metal chalcogenides include $Li_2O$, LiO, $Na_2S$, $Na_2Se$, and NaO.

Exemplary alkaline-earth metal chalcogenides include CaO, BaO, SrO, BeO, BaS, MgO, and CaSe.

Exemplary alkali metal halides include CsF, LiF, NaF, KF, LiCl, KCl, and NaCl.

Exemplary alkaline-earth metal halides include $CaF_2$, $BaF_2$, $SrF_2$, $MgF_2$, and $BeF_2$.

Examples of the inorganic semiconductor material for the electron injection layer 747 include oxides, nitrides and oxynitrides containing at least one selected from the groups consisting of Li, Na, Ba, Ca, Sr, Yb, Al, Ga, In, Cd, Mg, Si, Ta, Sb and Zn. These materials may be used singly or in combination.

The electron injection layer 747 preferably has a thickness of, but not limited to, about 0.1 to 1000 nm on average, more preferably about 0.2 to 100 nm, and still more preferably about 0.2 to 50 nm.

Sealing Member

The sealing member 75 covers the anode 741, the multilayer composite 749 and the cathode 748 to seal them for air tightness, and blocks oxygen and moisture. The presence of the sealing member 75 enhances the reliability of the light-emitting element 74 and prevents its deterioration or alteration to enhance the durability.

The sealing member 75 may be made of a metal such as Al, Au, Cr, Nb, Ta, Ti or their alloy, silicon oxide, or a resin material. If the sealing member 75 is electrically conductive, it is preferable that an insulating film be provided between the sealing member 75 and each of the anode 741, the multilayer composite 749 and the cathode 748 to prevent short-circuiting.

The sealing member 75 may be flat and oppose the support 72 with a sealant, such as thermosetting resin, filling the space between therebetween.

The light-emitting element 74 having the above-described structure has two electron transport layers (first electron transport layer 746 and second electron transport layer 745). These electron transport layers prevent holes having passed through the luminescent layer 744 from the anode 741 toward the cathode 748 from further transferring closer to the cathode 748 even if a high current is applied between the cathode 748 and the anode 741. Accordingly, even if the luminescent layer emits red light with high luminance, the light-emitting element 74 can be prevented from deteriorating to enhance the lifetime thereof.

The exposure head 13 including the light-emitting elements 74 can have a long lifetime and perform high resolution exposure.

Furthermore, the image-forming apparatus 1 including the exposure head 13 can form high-quality images and is superior in reliability.

The light-emitting element 74 may be manufactured in the following process.

(1) First, a support 72 is prepared, and an anode 741 is formed on the support 72.

The anode 741 can be formed by chemical vapor deposition (CVD) such as plasma CVD or thermal CVD, dry plating such as vacuum vapor deposition, wet plating such as electroplating, spraying, sol-gel method, metal organic deposition (MOD), or metal foil bonding.

(2) Then, a hole injection layer 742 is formed on the anode 741.

The hole injection layer 742 can be formed by a gas phase process, such as CVD or dry plating (vacuum vapor deposition, sputtering). Alternatively, the hole injection layer 742 may be formed by applying a hole injection layer-forming material onto the anode 741, followed by drying (removing the solvent or disperse medium). The hole injection layer-forming material can be prepared by dissolving a hole injection material in a solvent or dispersing it in a disperse medium.

The hole injection layer-forming material may be applied by a coating method, such as spin coating, roll coating, or ink jet printing. Such a coating method facilitates the formation of the hole injection layer 742. The solvent or disperse medium for the hole injection layer-forming material may be an inorganic solvent, an organic solvent or their mixture. For drying, the coating of the hole injection-forming material may be allowed to stand under atmospheric pressure or reduced pressure, or may be heated. An inert gas may be sprayed to the coating.

Before forming the hole injection layer 742, the upper surface of the anode 741 may be subjected to oxygen plasma treatment. This surface treatment imparts lyophilicity to the upper surface of the anode 741, removes organic deposit on the upper surface of the anode 741, and adjusts the work function around the upper surface of the anode 741. Preferably, the oxygen plasma treatment is performed, for example, at a plasma power of about 100 to 800 W and an oxygen gas flow rate of about 50 to 100 mL/min while the anode 741 (member to be treated) is transported at a speed of about 0.5 to 10 mm/s with the support 72 heated to about 70 to 90° C.

(3) Then, a hole transport layer 743 is formed on the hole injection layer 742.

The hole transport layer 743 can be formed by a gas phase process, such as CVD or dry plating (vacuum vapor deposition, sputtering). Alternatively, the hole transport layer 743 may be formed by applying a hole transport layer-forming material onto the hole injection layer 742, followed by drying (removing the solvent or disperse medium). The hole transport layer-forming material can be prepared by dissolving a hole transport material in a solvent or dispersing it in a disperse medium.

(4) Then, a luminescent layer 744 is formed on the hole transport layer 743.

The luminescent layer 744 can be formed by a gas phase process, such as CVD or dry plating (vacuum vapor deposition, sputtering).

(5) Then, a second electron transport layer 745 is formed on the luminescent layer 744.

The second electron transport layer 745 can be formed by a gas phase process, such as CVD or dry plating (vacuum vapor deposition, sputtering). Alternatively, the second electron transport layer 745 may be formed by applying an electron transport layer-forming material on the luminescent layer 744, followed by drying (removing the solvent or disperse medium). The electron transport layer-forming material can be prepared by dissolving an electron transport material in a solvent or dispersing it in a disperse medium.

(6) Then, a first electron transport layer 746 is formed on the second electron transport layer 745.

The first electron transport layer 746 can be formed by a gas phase process, such as CVD or dry plating (vacuum vapor deposition, sputtering). Alternatively, the first electron transport layer 746 may be formed by applying an electron transport layer-forming material onto the second electron transport layer 745, followed by drying (removing the solvent or disperse medium). The electron transport layer-forming material can be prepared by dissolving an electron transport material in a solvent or dispersing it in a disperse medium.

(7) Then, an electron injection layer 747 is formed on the first electron transport layer 746.

If an inorganic material is used for the electron injection layer 747, it can be formed by, for example, a gas phase process, such as CVD or dry plating (vacuum vapor deposition, sputtering), or coating and firing of an ink containing inorganic particles.

(8) Then, a cathode 748 is formed on the electron injection layer 747. The cathode 748 can be formed by, for example, vacuum vapor deposition, sputtering, metal foil bonding, or coating and firing of an ink containing metal particles.

The light-emitting element 74 is produced through the above steps. Finally, the light-emitting element 74 is covered with a sealing member 75, and the sealing member 75 is bonded to the support 72.

Although the light-emitting element, the exposure head and the image-forming apparatus have been described with reference to embodiments shown in the drawings, the invention is not limited to the disclosed embodiments. For example, an optional layer may be added between the layers at the anode side of the luminescent layer, or between the layers at the cathode side of the first electron transport layer.

EXAMPLES

Preparation of Light-Emitting Element

Examples of the invention will now be described.

Example 1

First, a transparent glass substrate having a thickness of 0.5 mm on average was prepared. Then, an ITO electrode (anode) was formed to a thickness of 100 nm on average on the substrate by sputtering. After being subjected to ultrasonic cleaning in acetone and 2-propanol in that order, the resulting substrate was treated with oxygen plasma.

Subsequently, the compound expressed by formula (7) was deposited on the ITO electrode by vacuum vapor deposition, thus forming a hole injection layer having a thickness of 40 nm on average.

Then, the compound expressed by formula (16) was deposited on the hole injection layer by vacuum vapor deposition, thus forming a hole transport layer having a thickness of 20 nm on average.

Subsequently, a luminescent layer material was deposited on the hole transport layer by vacuum vapor deposition, thus forming a red luminescent layer having a thickness of 40 nm on average. The luminescent layer material is constituted of the compound (diindenoperylene derivative) expressed by formula (17) as the red luminescent material (guest material or dopant) and the compound (naphthacene derivative) expressed by formula (18) as the host material. The red luminescent material content (dopant concentration) in the luminescent layer was 2.0% by weight.

Subsequently, a second electron transport material was deposited on the luminescent layer by vacuum vapor deposition, thus forming a second electron transport layer having a thickness of 5 nm on average. The second electron transport material was a mixture of the compound ($Alq_3$) expressed by formula (20) and the compound (rubrene derivative) expressed by formula (21). The rubrene derivative content (dopant concentration) in the second hole transport layer was 5.0% by weight.

Then, a first electron transport material was deposited on the second electron transport layer by vacuum vapor deposition, thus forming a first electron transport layer having a thickness of 25 nm on average. The compound (Bphen) expressed by formula (19) was used as the first electron transport material.

Subsequently, lithium fluoride (LiF) was deposited on the first electron transport layer by vacuum vapor deposition, thus forming an electron injection layer having a thickness of 1 nm on average.

Furthermore, Al was deposited on the electron injection layer by vacuum vapor deposition, thus forming a cathode having a thickness of 100 nm on average.

The resulting layers were covered with a glass protective cover (sealing member) for sealing the layers, and the protective cover was fixed with an epoxy resin.

A light-emitting element as shown in FIG. 1 was thus prepared.

Example 2

A light-emitting element was prepared in the same manner as in Example 1 except that the second electron transport layer was formed of the compound ($Alq_3$) expressed by formula (20). In other words, the light-emitting element of Example 2 was prepared in the same manner as in Example 1, except that the second electron transport layer of Example 2 was not doped with a rubrene derivative.

Comparative Example 1

A light-emitting element was prepared in the same manner as in Example 1, except that the second electron transport layer was not formed and the first electron transport layer was formed to a thickness of 30 nm.

Comparative Example 2

A light-emitting element was prepared in the same manner as in Example 1, except that the second electron transport layer was formed to a thickness of 30 nm.

Evaluation

A current was applied to each light-emitting element of the examples and comparative examples so that the light-emitting element could emit light having a luminance of 20,000 $cd/m^2$, and the current density (required current density) and voltage (required voltage) at this time were measured.

In addition, a constant current of 200 $mA/cm^2$ was applied to each light-emitting element, and the time (LT90) for which the luminance was reduced to 90% of the initial luminance was measured.

The results are shown in the Table. The lifetime was represented by relative values to the lifetime of the light-emitting element of Comparative Example 1.

TABLE

| | First electron transport layer | | Second electron transport layer | | Required current density ($mA/cm^2$) for 20000 $cd/m^2$ | Required voltage (V) for 20000 $cd/m^2$ | Lifetime (LT90) |
|---|---|---|---|---|---|---|---|
| | Constituent | Thickness (nm) | Constituent | Thickness (nm) | | | |
| Example 1 | Bphen | 25 | $Alq_3$ + Rubrene | 5 | 290 | 7.4 | 2.6 |
| Example 2 | Bphen | 25 | $Alq_3$ | 5 | 285 | 7.2 | 1.6 |
| Comparative Example 1 | Bphen | 30 | — | — | 280 | 7.2 | 1.0 |
| Comparative Example 2 | — | — | $Alq_3$ + Rubrene | 30 | 305 | 10.5 | 0.6 |

The table shows that the light-emitting elements of Examples 1 and 2 can emit sufficiently bright light to expose photoreceptors and, in addition, can exhibit a long lifetime. On the other hand, the light-emitting elements of Comparative Examples 1 and 2 exhibited low durability (life property).

The entire disclosure of Japanese Patent Application No. 2009-077819, filed Mar. 26, 2009 is expressly incorporated by reference herein.

What is claimed is:

1. A light-emitting element comprising:
a cathode;
an anode;
a luminescent layer disposed between the cathode and the anode, containing a naphthacene derivative, and a red luminescent material emitting red light, the red luminescent material being a diindenoperylene derivative;
a first electron transport layer disposed between the luminescent layer and the cathode, containing a first electron transport material; and
a second electron transport layer in contact with the luminescent layer and the first electron transport layer between the luminescent layer and the first electron transport layer, the second electron transport layer containing a second electron transport material different from the first electron transport material, the second electron transport layer further containing tris(8-quinolinolate)aluminum and a rubrene derivative.

2. The light-emitting element according to claim 1, wherein the rubrene derivative content in the second electron transport layer is in the range of 0.5% to 20% by weight.

3. The light-emitting element according to claim 1, wherein the first electron transport layer and the second electron transport layer satisfy the relationship $10\% \leq A/B < 90\%$, wherein A represents the thickness of the second electron transport layer and B represents the thickness of the first electron transport layer.

4. The light-emitting element according to claim 1, wherein the second electron transport layer has a thickness in the range of 2 to 15 nm.

5. The light-emitting element according to claim 1, wherein the total thickness of the first electron transport layer and the second electron transport layer is in the range of 10 to 100 nm.

6. The light-emitting element according to claim 1, wherein the first electron transport layer contains a phenanthroline derivative.

7. The light-emitting element according to claim 1, wherein the first electron transport layer and the second electron transport layer have an interface containing the first electron transport material and the second electron transport material therebetween.

8. An exposure head comprising the light-emitting element as set forth in claim 1.

9. The exposure head according to claim 8, further comprising an imaging optical system focusing light from the light-emitting element, wherein a plurality of the light-emitting elements are arranged in one direction and emit light to a light emitting side, and the imaging optical system is disposed at the light emitting side of the light-emitting elements.

10. An image-forming apparatus comprising the exposure head as set forth in claim 8.

11. The light-emitting element according to claim 1, wherein the red luminescent material contains a combination of red fluorescent material and red phosphorescent material.

12. The light-emitting element according to claim 11, wherein the red phosphorescent material is selected from the group consisting of: iridium, ruthenium, platinum, osmium, rhenium and palladium.

13. The light-emitting element according to claim 1, the luminescent layer further comprising:
a host material, wherein
the host material includes a red phosphorescent material, and
the red phosphorescent material includes a carbazole derivative.

14. The light-emitting element according to claim 1, wherein the first electron transport material contains a phenanthroline derivative.

15. The light-emitting element according to claim 1, further comprising:
a hole transport layer disposed between the luminescent layer and the anode, wherein
the luminescent layer is directly connected to the hole transport layer on the anode-facing side thereof, and the second electron transport layer on the cathode-facing side thereof.

16. A light-emitting element producing red light comprising:
a cathode;
an anode;
a luminescent layer disposed between the cathode and the anode, containing a naphthacene derivative, and a red luminescent material emitting red light, the red luminescent material being a diindenoperylene derivative;
a first electron transport layer disposed between the luminescent layer and the cathode, containing a first electron transport material; and
a second electron transport layer in contact with the luminescent layer and the first electron transport layer between the luminescent layer and the first electron transport layer, the second electron transport layer containing a second electron transport material different from the first electron transport material, the second electron transport layer further containing tris(8-quinolinolate)aluminum and a rubrene derivative.

17. The light-emitting element according to claim 16, further comprising:
a hole transport layer disposed between the luminescent layer and the anode, wherein
the luminescent layer is directly connected to the hole transport layer on the anode-facing side thereof, and the second electron transport layer on the cathode-facing side thereof.

* * * * *